United States Patent
Palmateer

(10) Patent No.: US 7,551,246 B2
(45) Date of Patent: Jun. 23, 2009

(54) SYSTEM AND METHOD FOR DISPLAY DEVICE WITH INTEGRATED DESICCANT

(75) Inventor: Lauren Palmateer, San Francisco, CA (US)

(73) Assignee: IDC, LLC., San Francisco, CA (US)

(*) Notice: Subject to any disclaimer, the term of this patent is extended or adjusted under 35 U.S.C. 154(b) by 749 days.

(21) Appl. No.: 11/107,518

(22) Filed: Apr. 15, 2005

(65) Prior Publication Data

US 2006/0077146 A1 Apr. 13, 2006

Related U.S. Application Data

(60) Provisional application No. 60/613,300, filed on Sep. 27, 2004.

(51) Int. Cl.
*G02F 1/1335* (2006.01)
(52) U.S. Cl. .................... 349/106; 349/105
(58) Field of Classification Search ............. None
See application file for complete search history.

(56) References Cited

U.S. PATENT DOCUMENTS

| | | | |
|---|---|---|---|
| 4,036,360 A | 7/1977 | Deffeyes | |
| 4,074,480 A | 2/1978 | Burton | |
| 4,531,126 A | 7/1985 | Sadones | |
| 4,844,614 A | 7/1989 | Henderson et al. | |
| 4,977,009 A | 12/1990 | Anderson et al. | |
| 5,244,707 A | 9/1993 | Shores | |
| 5,304,419 A | 4/1994 | Shores | |
| 5,591,379 A | 1/1997 | Shores | |
| 5,610,438 A | 3/1997 | Wallace et al. | |
| 5,614,785 A | 3/1997 | Wallace et al. | |
| 5,835,255 A | 11/1998 | Miles | |
| 5,882,761 A | 3/1999 | Kawami et al. | |
| 5,939,785 A | 8/1999 | Klonis et al. | |
| 6,040,937 A | 3/2000 | Miles | |
| 6,055,090 A | 4/2000 | Miles et al. | |
| 6,261,853 B1 | 7/2001 | Howell et al. | |
| 6,445,062 B1 | 9/2002 | Honda | |
| 6,589,625 B1 | 7/2003 | Kothari et al. | |

(Continued)

FOREIGN PATENT DOCUMENTS

EP 0 667 548 8/1995

(Continued)

OTHER PUBLICATIONS

Keusseyan et al., A new approach for opto-electronic/MEMS packaging, Proceedings 52nd Electronic Components and Technology Conference, ECTC May 2002, pp. 259-262.

(Continued)

*Primary Examiner*—Sung H Pak
(74) *Attorney, Agent, or Firm*—Knobbe, Martens, Olson & Bear LLP

(57) ABSTRACT

A package structure and method of packaging an interferometric modulator with an integrated desiccant. An interferometric modulator is formed on a transparent substrate. A backplane is joined to the transparent substrate to form a package structure and to encapsulate the interferometric modulator. A desiccant integrated into the backplane or the transparent substrate is provided to absorb moisture within the package.

29 Claims, 10 Drawing Sheets

U.S. PATENT DOCUMENTS

| | | |
|---|---|---|
| 6,650,455 B2 | 11/2003 | Miles |
| 6,674,562 B1 | 1/2004 | Miles et al. |
| 6,680,792 B2 | 1/2004 | Miles |
| 6,791,660 B1 | 9/2004 | Hayashi et al. |
| 7,042,643 B2 | 5/2006 | Miles |
| 7,123,216 B1 | 10/2006 | Miles |
| 7,164,520 B2 | 1/2007 | Palmateer et al. |
| 2002/0024711 A1 | 2/2002 | Miles |
| 2002/0054424 A1 | 5/2002 | Miles |
| 2002/0056900 A1 | 5/2002 | Liu et al. |
| 2002/0063322 A1 | 5/2002 | Robbins et al. |
| 2002/0119724 A1 | 8/2002 | Hammel |
| 2002/0126364 A1 | 9/2002 | Miles |
| 2002/0149096 A1 | 10/2002 | Liebeskind |
| 2003/0062186 A1 | 4/2003 | Boroson et al. |
| 2003/0108306 A1 | 6/2003 | Whitney et al. |
| 2003/0121418 A1* | 7/2003 | Loop et al. ............... 96/117.5 |
| 2003/0122137 A1 | 7/2003 | Hashimoto |
| 2003/0138656 A1 | 7/2003 | Sparks |
| 2003/0152872 A1 | 8/2003 | Miles |
| 2003/0160021 A1 | 8/2003 | Platt et al. |
| 2003/0184412 A1 | 10/2003 | Gorrell |
| 2004/0051929 A1 | 3/2004 | Sampsell |
| 2004/0061492 A1 | 4/2004 | Lopes et al. |
| 2004/0100677 A1 | 5/2004 | Huibers et al. |
| 2004/0122175 A1 | 6/2004 | Hekal |
| 2004/0166603 A1 | 8/2004 | Carley |
| 2004/0184133 A1 | 9/2004 | Su et al. |
| 2004/0213962 A1 | 10/2004 | Bourdelais et al. |
| 2004/0259370 A1 | 12/2004 | Bergman |
| 2005/0074919 A1 | 4/2005 | Patel et al. |
| 2005/0093134 A1 | 5/2005 | Tarn |
| 2005/0247477 A1 | 11/2005 | Kothari et al. |
| 2005/0253283 A1 | 11/2005 | Dcamp et al. |
| 2006/0066935 A1 | 3/2006 | Cummings et al. |
| 2007/0170568 A1 | 7/2007 | Palmateer et al. |
| 2008/0164544 A1 | 7/2008 | Palmateer et al. |

FOREIGN PATENT DOCUMENTS

| | | |
|---|---|---|
| EP | 0 969 700 | 1/2000 |
| EP | 1 251 546 | 10/2002 |
| EP | 1418154 A2 | 5/2004 |
| JP | 02-068513 | 3/1990 |
| JP | 03-199920 | 8/1991 |
| WO | WO 02/39513 | 5/2002 |
| WO | WO 02/42716 A2 | 5/2002 |
| WO | WO 03/009317 | 1/2003 |
| WO | WO 03/026369 A1 | 3/2003 |
| WO | WO 2005/110914 | 11/2005 |
| WO | WO 2005/114294 | 12/2005 |

OTHER PUBLICATIONS

Previti et al., Getters: micromolecular scavengers for packaging, Proceedings International Symposium on Advanced Packaging Materials Processes, Properties and Interfaces, 2001, pp. 201-206.

Extended European Search Report for App. No. 05255658.6, dated Mar. 12, 2008.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

EP Search Report for EP patent No. 05255700.6—2217, Dec. 30, 2005.

International Search Report and Written Opinion for PCT/US05/013464, Oct. 24, 2005.

Office Action dated Apr. 25, 2008 in Chinese App. No. 200510105836.9.

* cited by examiner

SYSTEM AND METHOD FOR DISPLAY DEVICE WITH INTEGRATED DESICCANT

RELATED APPLICATIONS

This application claims priority to U.S. Provisional Application No. 60/613,300 filed Sep. 27, 2004, the contents of which are hereby incorporated by reference in their entirety.

BACKGROUND

1. Field

The field of the invention relates to microelectromechanical systems (MEMS) and the packaging of such systems. More specifically, the field of the invention relates to interferometric modulators and methods of fabricating such modulators with a desiccant material.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An embodiment provides a display device comprising a transparent substrate, an interferometric modulator configured to modulate light transmitted through the transparent substrate, and a backplane cover disposed on the modulator and sealing the modulator within a package between said transparent substrate and the backplane cover, wherein the backplane cover has an integrated desiccant configured to absorb moisture within the package.

In accordance with another embodiment, a method of manufacturing a display device is provided. According to this method, a transparent substrate is provided and an interferometric modulator is formed on the transparent substrate. A backplane is then joined to the transparent substrate to form a package to encapsulate the interferometric modulator. A desiccant integrated within the package is also provided.

According to another embodiment, a display device is provided, comprising a package, an electronic display, and a desiccant. The package comprises a transparent substrate, a backplane, and a seal applied between the backplane and the transparent substrate. The electronic display is configured to modulate light transmitted through the transparent substrate, and is formed on the transparent substrate and positioned between the transparent substrate and the backplane. The desiccant integrated into the package, and is configured to absorb moisture within the package.

According to yet another embodiment, a display device is provided. The display device includes a transmitting means for transmitting light therethrough, a modulating means configured to modulating light transmitted through the transmitting means, an encapsulating means for sealing the modulating means within a package between the transmitting means and the encapsulating means, and a moisture absorbing means for absorbing moisture within a package. The modulating means comprises an interferometric modulator, and the moisture absorbing means is integrated into either the transmitting means or the encapsulating means.

According to another embodiment, a method of manufacturing a display device is provided. A transparent substrate is provided and an interferometric modulator is formed on the transparent substrate. A backplane having recessed areas on an interior surface is provided. Desiccant is applied to the recessed areas on the interior surface, and the backplane is joined to the transparent substrate to form a package after applying the desiccant.

BRIEF DESCRIPTION OF THE DRAWINGS

These and other aspects of the invention will be readily apparent from the following description and from the appended drawings (not to scale), which are meant to illustrate and not to limit the invention, and wherein.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
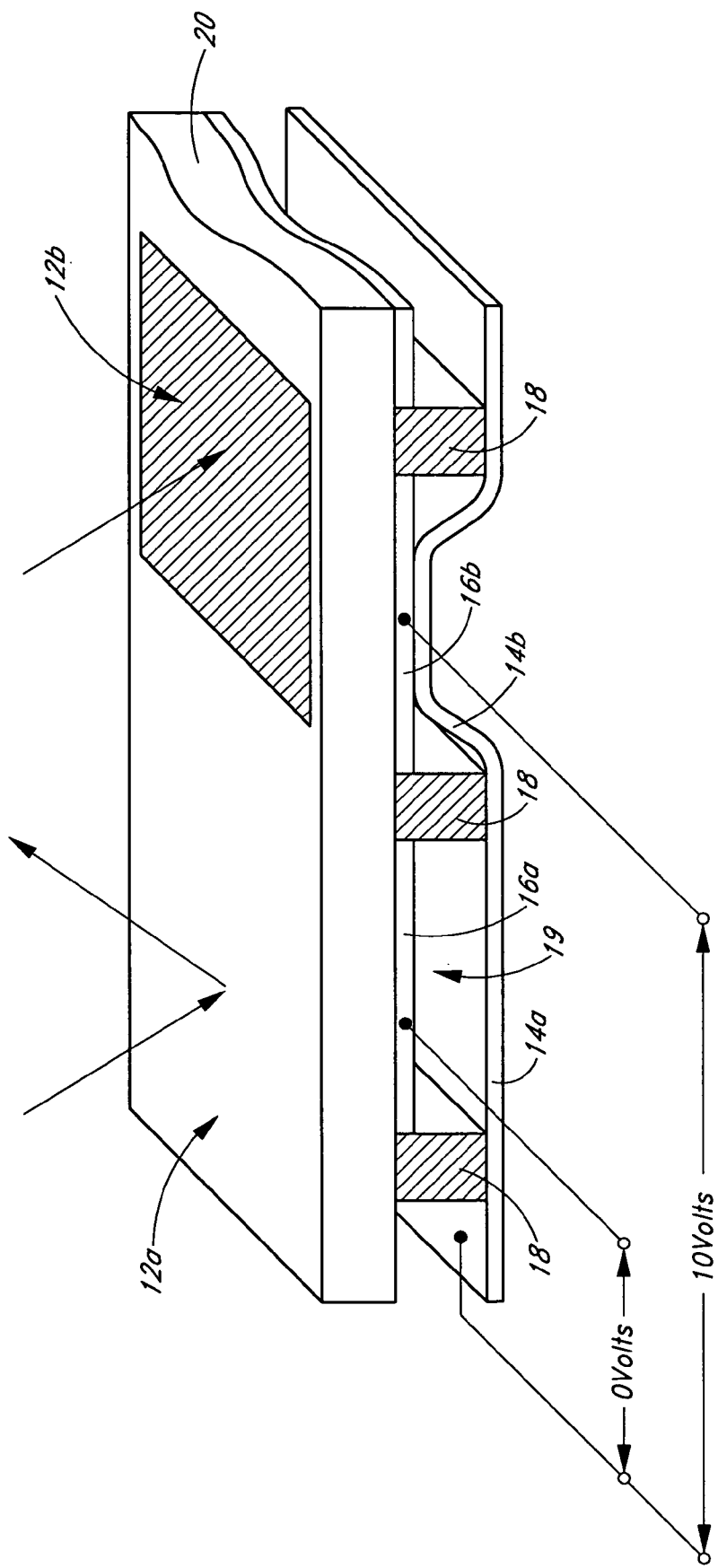
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
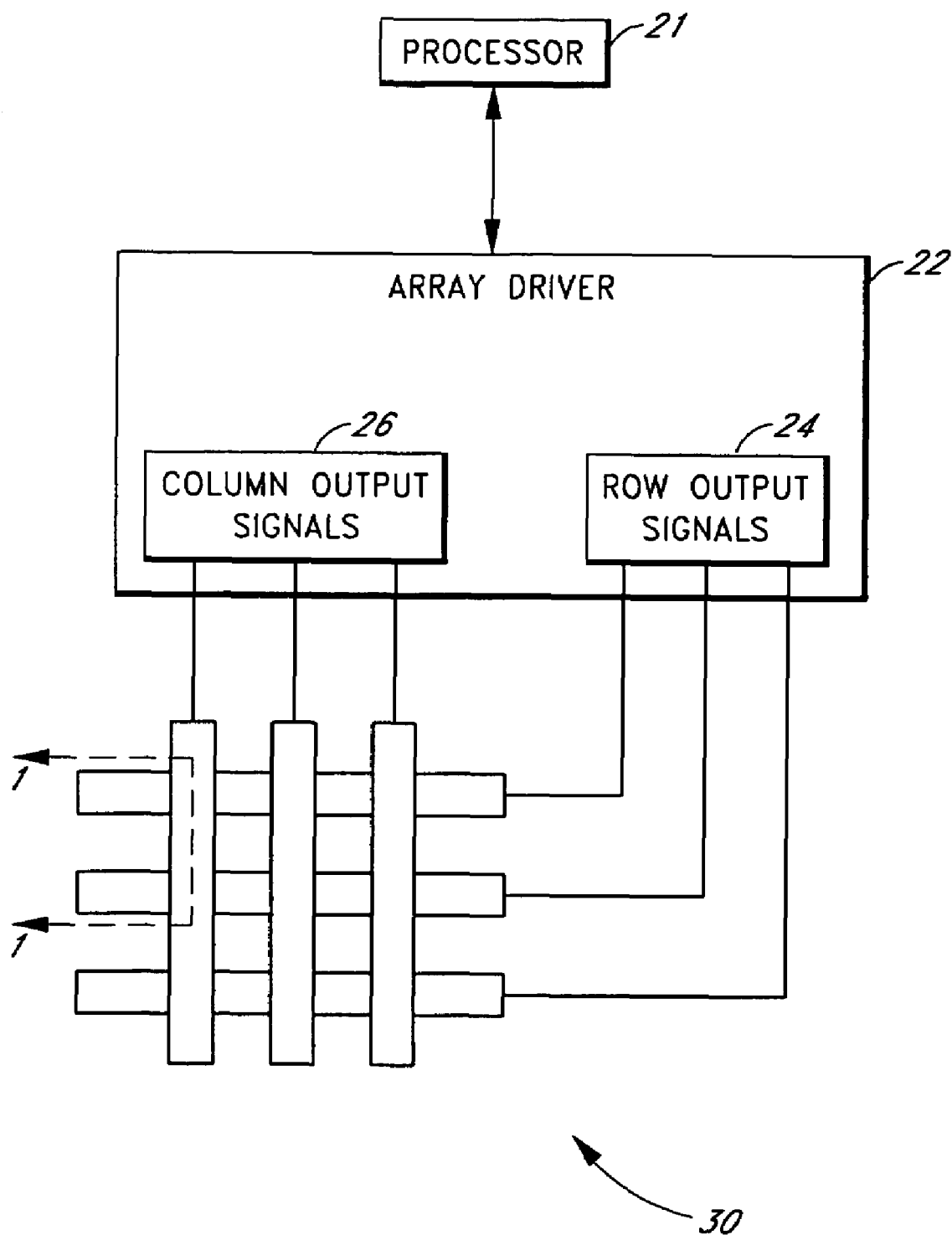
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
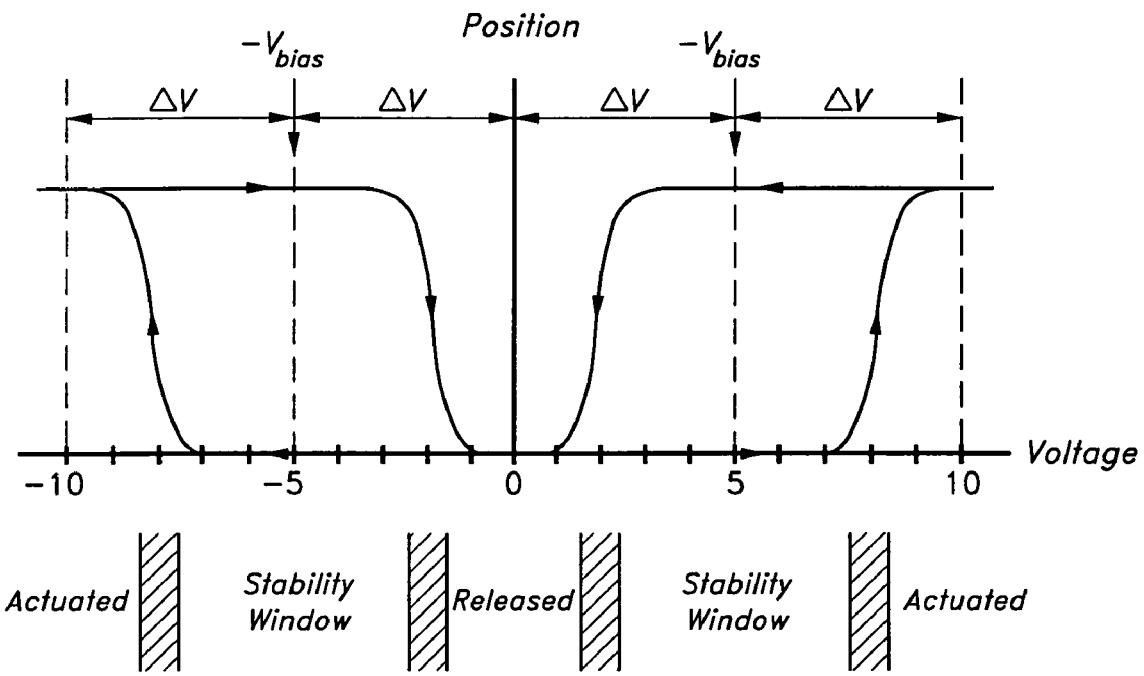
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
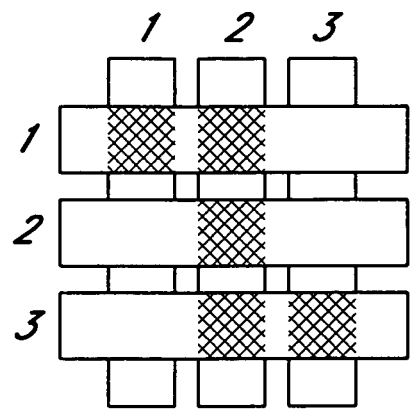
FIGS. 5A and 5B illustrate one exemplary timing diagram for row and column signals that may be used to write a frame of display data to the 3×3 interferometric modulator display of FIG. 2.
Figure 5B:
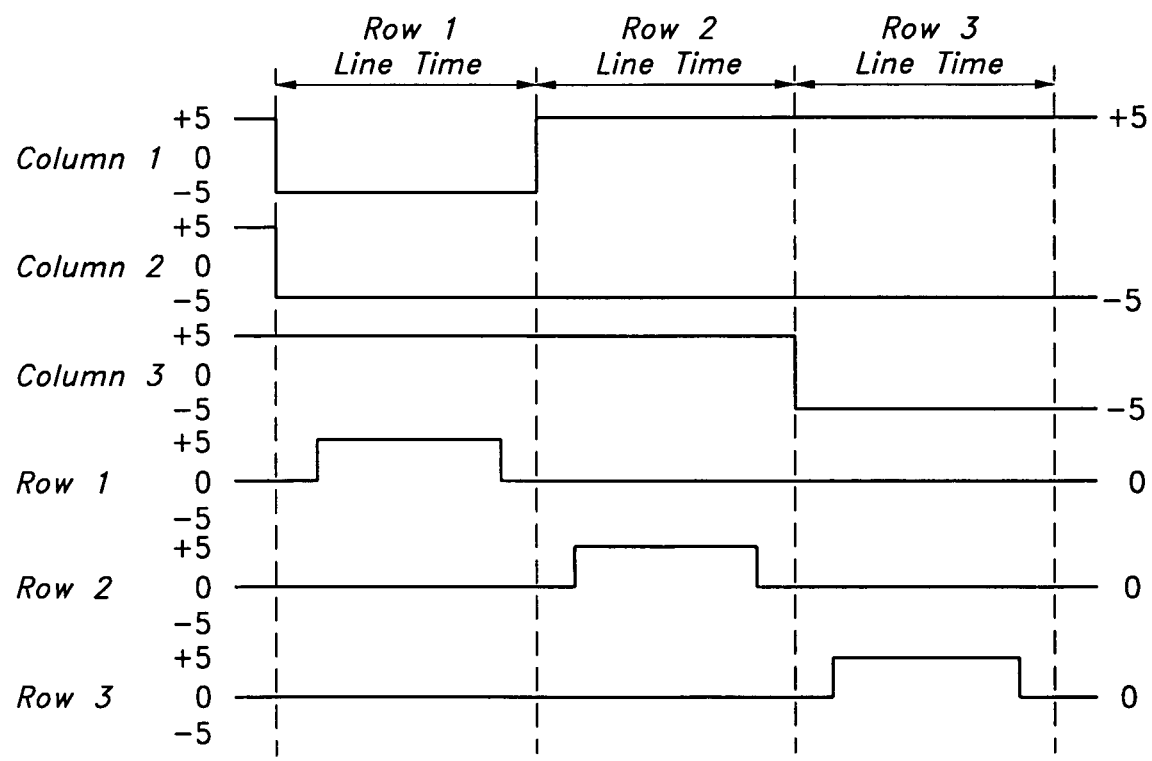

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
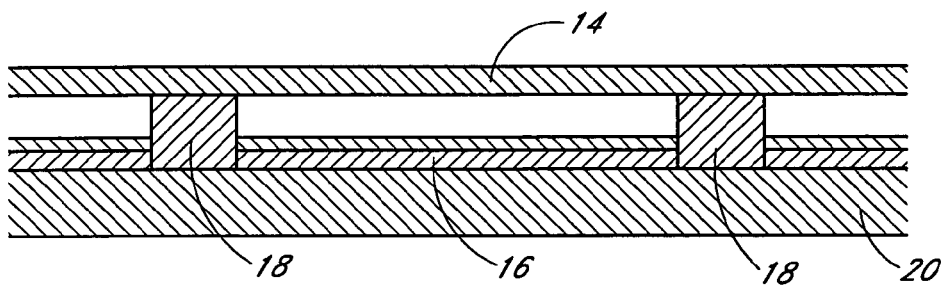
FIG. 6A is a cross section of the device of FIG. 1.
Figure 6B:
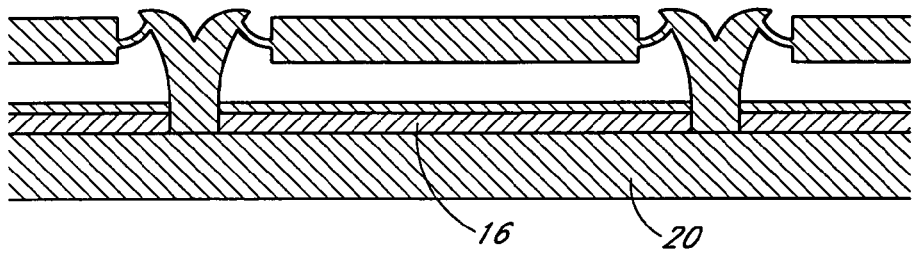
FIG. 6B is a cross section of an alternative embodiment of an interferometric modulator.
Figure 6C:
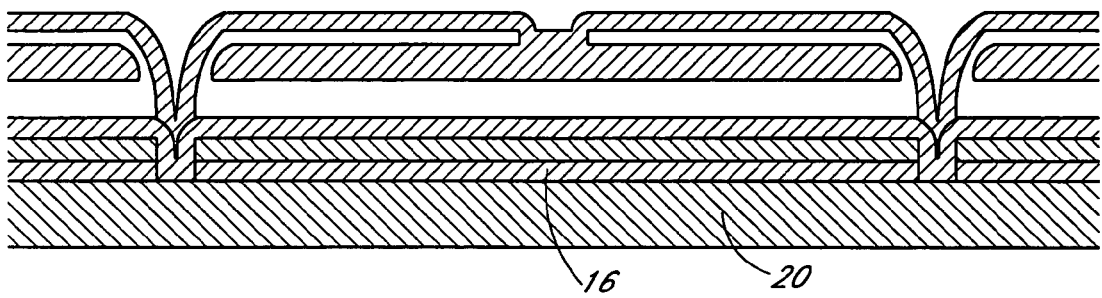
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

Figure 7:
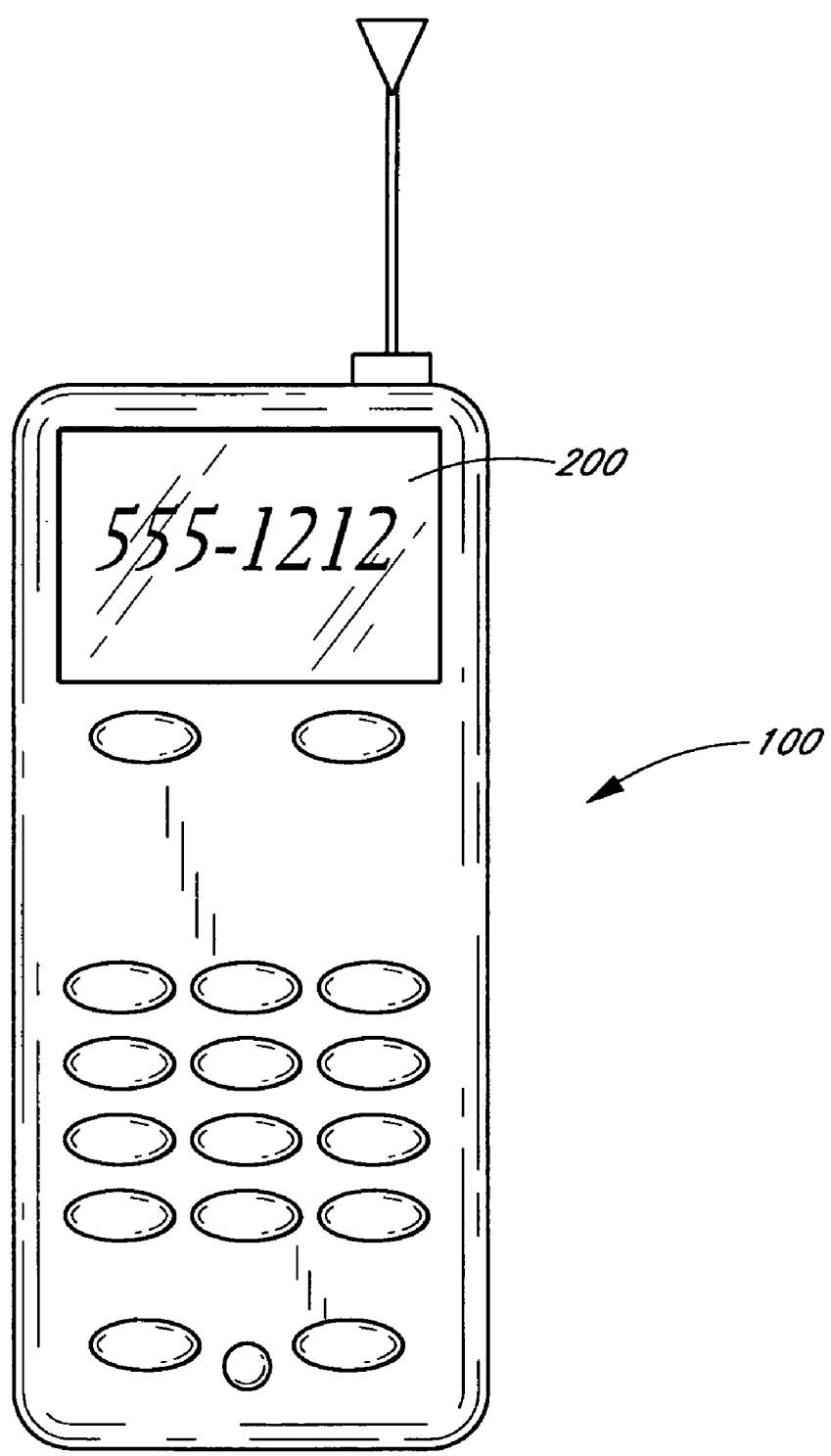
FIG. 7 schematically illustrates a front view of one embodiment of a wireless telephone handset having an electronic display.

FIG. 7 illustrates a wireless telephone handset 100 having an electronic display 200. In this illustration, the electronic display 200 displays the telephone number "555-1212". It will be understood that the electronic display 200 may display other information, including, but not limited to, other text and images, either moving or static.

The electronic display 200 can be any type of display, including, but not limited to, light emitting diode (LED), organic light emitting diode (OLED), or an interferometric modulator (IMOD) direct view electronic display. Embodiments of the invention relate to the manufacturing and packaging of these types of electronic displays with a desiccant. The packages and packaging methods described herein may be used for packaging a variety of electronic displays, including, but not limited to, the interferometric modulators described above.

Figure 8:
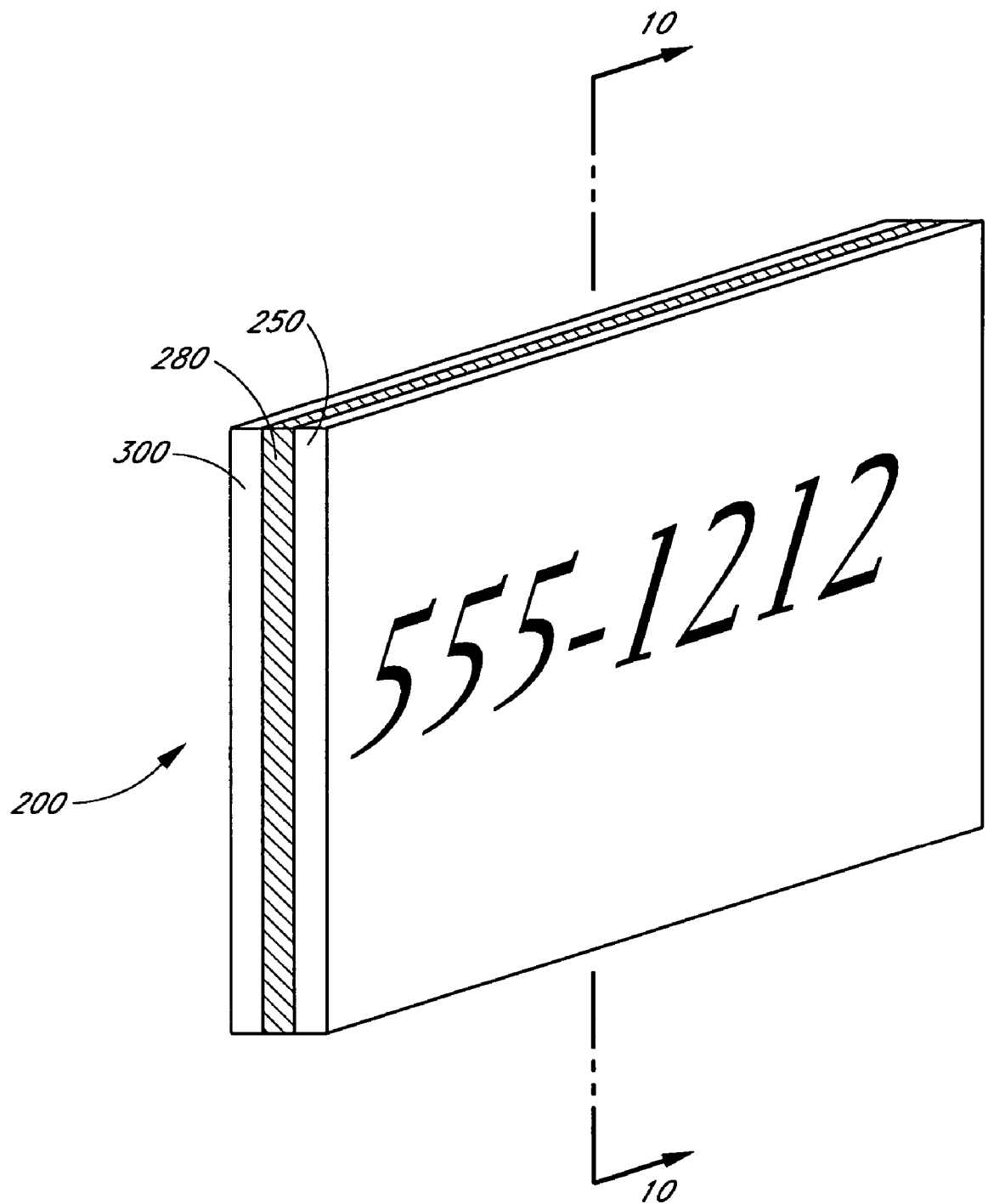
FIG. 8 schematically illustrates a perspective view of one embodiment of an electronic display.

FIG. 8 shows a perspective view of the display 200 from FIG. 7. As shown in FIG. 8, the display 200 of this embodiment has a transparent or semi-transparent front surface 250, a seal 280 and a backplane 300. As will be explained below, within the display 200, and between the transparent front surface 250 and backplane 300 are the electronics for the particular display technology. For example, within the display may be the electronics for an LED, OLED or IMOD display device. It should be realized that each of these display types has a different degree of sensitivity to moisture. Thus, it is advantageous to provide a means for reducing the amount of moisture that may come in contact with the display device.

Figure 9A:
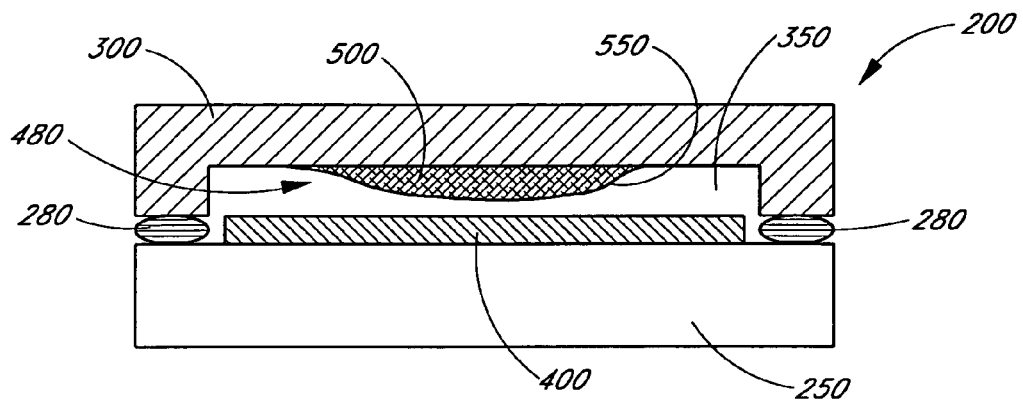
FIG. 9A schematically illustrates a cross-sectional view of one embodiment of an electronic display taken across the line 10-10 from FIG. 8.

Packaging techniques for a MEMS device will be described in more detail below. A schematic of a basic package structure for a MEMS device, such as an interferometric modulator array, is illustrated in FIG. 9A. As shown in FIG. 9A, a basic package structure 200 includes a substrate 250 and a backplane cover or "cap" 300, wherein an interferometric modulator array 400 is formed on the substrate 250. This backplane or cap 300 may also be referred to as a "backplate." It will be understood that the terms "display," "package structure," and "package" may be used interchangeably, as used herein.

According to the embodiment shown in FIG. 9A, the substrate 250 and the backplane 300 are joined by a seal 280 to form the package structure 200, such that the interferometric modulator array 400 is encapsulated by the substrate 250, backplane 300, and the seal 280. The interferometric modulator provides a The substrate provides a means for transmitting transmitting light therethrough. The backplane provides an encapsulating means for sealing the interferometric modulator within a package between the transparent substrate and the backplane As shown in FIG. 9A, there is a cavity 350 between the backplane 300 and the substrate 250. The moving parts of a MEMS device, such as the movable mirrors 14a, 14b of an interferometric modulator array described above, preferably have a protected space in which to move. As illustrated in FIG. 9A, the cavity 350 can be provided by the use of a backplane 300 that has a recessed cavity. Using a recessed cavity 350 allows the seal 280 to be relatively thin, and thus less subject to transmission of water vapor.

The seal 280 is provided to join the substrate 250 and the backplane 300 to form the package structure 200. The seal 280 may be a non-hermetic seal, such as a conventional epoxy-based adhesive. In other embodiments, the seal 280 may be a polyisobutylene (sometimes called butyl rubber, and other times PEB), o-rings, polyurethane, thin film metal weld, liquid spin-on glass, solder, polymers, or plastics, among other types of seals that may have a range of permeability of water vapor of about 0.2-4.7 g mm/m$^2$ kPa day. In still other embodiments, the seal 280 may be a hermetic seal.

The substrate 250 may be a semi-transparent or transparent substance capable of having thin film, MEMS devices built upon it. Such transparent substances include, but are not limited to, glass, plastic, and transparent polymers. Images are displayed through the substrate 250, which serves as an imaging surface. The interferometric modulator array 400 may comprise membrane modulators or modulators of the separable type. Examples of such devices are described in U.S. Pat. No. 5,835,255 to Miles, which is hereby incorporated by reference in its entirety. The skilled artisan will appreciate that the backplane 300 may be formed of any suitable material, such as glass, metal, foil, polymer, plastic, ceramic, or semiconductor materials (e.g., silicon).

Generally, it is desirable to minimize the permeation of water vapor into the package structure and thus control the environment inside the package structure 200 and hermetically seal it to ensure that the environment remains constant. An example of a hermetic sealing process is disclosed in U.S. Pat. No. 6,589,625. When the humidity within the package structure 200 exceeds a level beyond which surface tension from the moisture becomes higher than the restoration force of a movable element (e.g., the movable mirrors 14a, 14b described above) in the interferometric modulator 400, the movable element may become permanently stuck to the surface.

A desiccant may be used to control moisture resident within the package structure 200. The package structure 200 preferably includes an integrated desiccant (e.g., desiccant integrated into the backplane material or transparent substrate material, desiccant contained within a pouch integrated with the backplane, or desiccant that is deposited or otherwise incorporated into the backplane during fabrication of the backplane) configured to reduce moisture within the cavity 350. In the embodiment shown in FIG. 9A, a desiccant pouch 480 is positioned between the interferometric modulator array 400 and the backplane 300. The desiccant may also be applied to or otherwise integrated with the backplane in the recessed area(s) during fabrication of the backplane, as described in more detail below.

Desiccants may be used for packages that have either hermetic or non-hermetic seals. In packages having a hermetic seal, desiccants are typically used to control moisture resident within the interior of the package. In packages having a non-hermetic seal, a desiccant may be used to control moisture moving into the package from the environment. The skilled artisan will appreciate that a desiccant may not be necessary for a hermetically sealed package, but may be desirable to control moisture resident within the package or to capture outgassed or residual water from epoxy or other outgassed materials or materials from surfaces inside the package.

According to the embodiments described herein, the desiccant preferably is configured to absorb water molecules that permeate the display package structure once it has been manufactured as well as after sealing. As can be appreciated, the desiccant maintains a low humidity environment within the package structure and prevents water vapor from adversely affecting the operation of the display electronics (e.g., interferometric modulator). This maintenance of a low humidity environment will be explained more completely with reference to FIGS. 9-12 below.

As illustrated in FIG. 9A, also sealed within the display 200 is a desiccant pouch 480. In these embodiments, the desiccant pouch 480 is formed within the cavity 350 and attached to the backplane 300. The desiccant pouch 480 includes a desiccant material 500, and a membrane cover 550. The desiccant pouch 480 may be used within displays that have either hermetic or non-hermetic sealants. In displays having a hermetic seal, the desiccant pouch 480 can be used to control moisture resident within the interior of the package. In displays having a non-hermetic seal, the desiccant pouch 480 may be used to control moisture moving into the package from the surrounding environment.

The membrane 550 of the pouch 480 preferably is made from a compound that is strong enough to contain the desiccant material 500, but also allows water vapor to pass through the membrane 550 and contact the desiccant material 500. An example of such a material is Tyvek® (DuPont Corporation) or polyethylene, preferably with a low moisture vapor transmission rate (MVTR). The MVTR of the membrane 550 depends upon the type and thickness of the materials used and the external environmental conditions. It should be realized that, in some embodiments, the membrane 550 can adhere directly to the backplane 300, 310, or be sealed to the backplane 300, 310 with an adhesive. Suitable adhesives include, but are not limited to, adhesives in a PSA (pressure sensitive adhesive) thin-film patch and dispensed adhesives, preferably epoxies, thermal or UV, with low outgassing specifications, such as those compliant with NASA specifications.

Table 1 below provides the MVTR for a number of membrane materials suitable for the membrane 550. By knowing the MVTR (in grams of water per square foot per day), the total surface area of the membrane 550 (membrane surface area) and the rate of water permeation into the package 200, 210 through the perimeter seal, the required MVTR of the membrane 550 can be calculated to ensure that the desiccant can absorb at a sufficient rate to keep the interior of the package 200, 210 dry enough for proper operation.

TABLE 1

| Material | MVTR* gm/m²-day | MVTR* gm/ft²-day |
|---|---|---|
| Aluminum Foil Wrapping 0.025 mm | 0.5 | 0.05 |
| Aluminum Foil Wrapping 0.009 mm | 1.0 | 0.09 |
| Cellulose Films ('Cellophane') 400's MXXT Grade (Polyvinylidene Chloride Coated) | 1.5 | 0.14 |
| Polyvinylidene/Polyvinyl Chloride Films ('Saran') 0.005 cm (0.002 in) | | |
| Polyvinylidene/Polyvinyl Chloride Films ('Saran') 0.0013 cm (0.0005 in) | 3.0 | 0.28 |
| Polyethylene Films ('Polythene') 0.0125 cm (0.005 in) | 4.0 | 0.37 |
| Waxed Paper (45.5 kg (100 lb) per DC Ream) | | |
| Cellulose Films ('Cellophane') 300's MSAT Grade (Cellulose Nitrate Coated) | 7.5 | 0.70 |
| Glassine Lacquered (16 kg (35 lb) per DC Ream) | 9.0 | 0.84 |
| Polyethylene Film ('Polythene') 0.005 cm (0.002 in) | 10.0 | 0.93 |
| Polyethylene Film ('Polythene') 0.0025 cm (0.001 in) | 20.0 | 1.86 |
| Polyethylene Coated Kraft (9 kg (20 lb) per DC Ream) | 30.0 | 2.79 |

*Determined at 100° F. and 90% relative humidity

Generally, any substance that can trap moisture while not interfering with the optical properties of the interferometric modulator array may be used as the desiccant material 500. Preferably, the desiccant does not interfere with the optical properties of the interferometric modulators 400. Suitable desiccant materials 500 include, but are not limited to, zeolites, calcium sulfate, calcium oxide, silica gel, molecular sieves, surface adsorbents, bulk adsorbents, and chemical reactants. Other desiccant materials include indicating silica gel, which is silica gel with some of its granules coated with cobalt chloride. The silica changes color as it becomes saturated with water. Calcium oxide is a material that relatively slowly absorbs water.

Figure 9B:
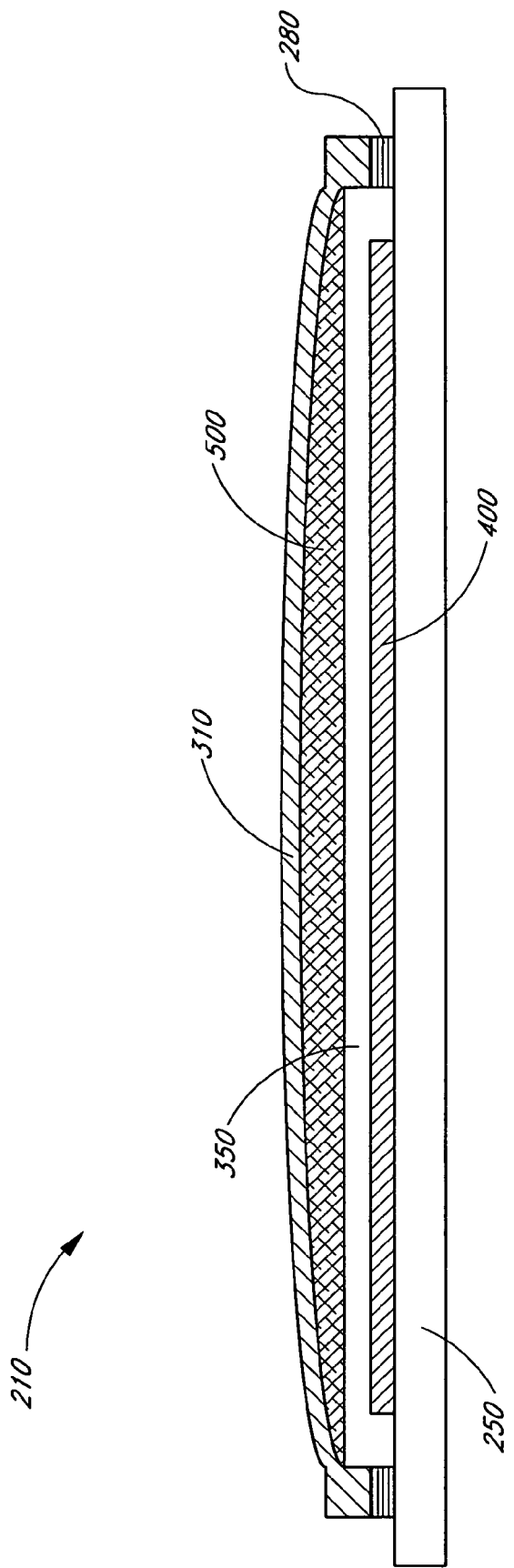
FIG. 9B schematically illustrates a cross-sectional view of a first alternate embodiment of an electronic display taken across the line 10-10 from FIG. 8.

It will be understood that, in certain embodiments, the desiccant material 500 may be inserted into the cavity 350 of a package structure 210 without a pouch 480 or membrane cover 550, as shown in FIG. 9B. The backplane 310 in the embodiment shown in FIG. 9B does not have as deep a recessed cavity as the backplane 300 of the embodiment shown in FIG. 9A. The skilled artisan will appreciate that the desiccant material 500 may be inserted into the cavity 350, without a pouch 480 or membrane cover 550, in a package having a backplane with a recessed cavity, such as the one shown in FIG. 9A.

The desiccant may be in different forms, shapes, and sizes. In addition to being in solid or gel form, the desiccant material 500 may alternatively be in powder form. These powders may be inserted directly into the pouch 480 or directly into the package without a pouch 480, or they may be mixed with an adhesive for application. In an alternative embodiment, the desiccant may be formed into different shapes, such as cylinders or sheets, before being applied inside the package. It should be realized that the desiccant pouch 480 may take any form, and can be of any thickness that provides the proper desiccating function for the display 200, 210.

The skilled artisan will understand that the desiccant material 500 can be applied and integrated with the package in different ways. In one embodiment, the desiccant material 500 is deposited as part of the interferometric modulator array 400. In another embodiment, the desiccant material 500 is applied inside the package as a spray or a dip coat.

In another embodiment, the desiccant material 500 may be printed or sprayed onto a surface of the interior of the package, such as the backplane after it has been sandblasted or etched using standard photolithographic techniques. A mask is preferably first applied to the backplane prior to etching, preferably using standard photolithographic techniques, in order to form recessed pockets or windows in the backplane, allowing the package to be thinner with a thinner perimeter seal, preferably having a thickness of about 15 microns. The skilled artisan will also appreciate that a thinned perimeter seal allows lower water vapor flux into the package and the package/device would therefore have a longer lifetime. It will be understood that etching techniques, such as sandblasting and wet etching, are preferred. The skilled artisan will understand that, alternatively, a stencil may be used instead of a photolithographic mask. After the pockets or windows have been created, the desiccant material 500 is applied (e.g., sprayed or brushed on) in the recessed pockets or windows. It will be understood that the mask is preferably not removed until the desiccant material 500 has been applied to the recessed pockets or windows so that there is little danger of applying the desiccant material 500 to the non-recessed areas of the backplane. A thin foil may be applied over the desiccant material to protect the desiccant material 500 if the backplane is manufactured and transported prior to assembly with other parts of the package. The desiccant material 500 may be activated after the package is completed.

Typically, in packages containing desiccants, the lifetime expectation of the device may depend on the lifetime of the desiccant. When the desiccant is fully consumed, the interferometric modulator 400 may fail to operate as sufficient moisture enters the cavity 350 and causes damage to the interferometric modulator 400. The theoretical maximum lifetime of the display device is determined by the water vapor flux into the cavity 350 as well as the amount and type of desiccant material.

The theoretical lifetime of the device may be calculated with the following equations:

$$\text{lifetime} = \frac{\text{desiccant\_capacity (g)}}{\text{water\_vapor\_flux (g/area/day)} * \text{perimeter\_seal\_area}}$$

$$\text{water vapor flux} = -P\frac{dp}{dt}$$

where P is the water vapor permeation coefficient for the perimeter seal 280 and dp/dt is the water vapor pressure gradient across the width of the seal 280.

In the embodiment of a display having a hermetic seal, the lifetime of the device is not as dependent on the desiccant capacity, or the geometry of the seal. In display devices wherein the seal 280 is not hermetic, the lifetime of the device is more dependent on the capacity of the desiccant to absorb and retain moisture.

Figure 10:
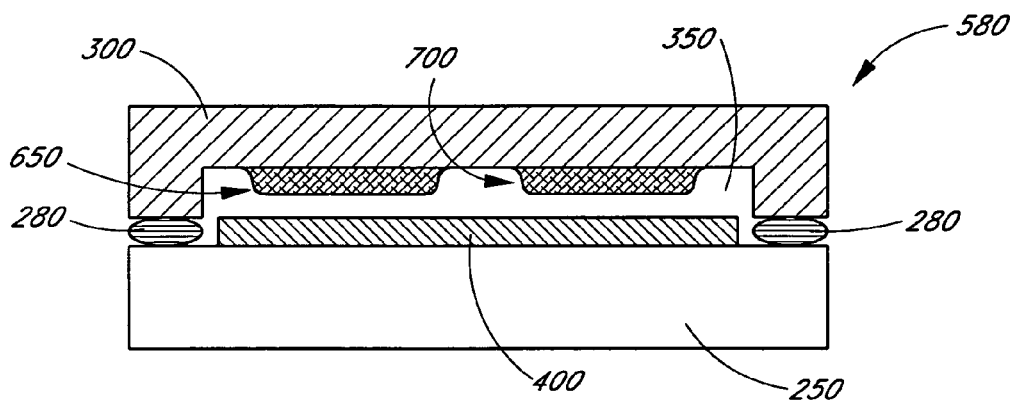
FIG. 10 schematically illustrates a second alternate embodiment of an electronic display taken across the line 10-10 from FIG. 8.

Another embodiment of a display 580 is illustrated in FIG. 10. As shown, two desiccant pouches 650, 700 are formed within the interior cavity 350. The two desiccant pouches 650, 700 function to remove moisture from within the cavity 350. It should be realized that, in this embodiment, the desiccant material 500 used to fill the pouches 650, 700 can be the same or different in the two pouches 650, 700. For example, one pouch may be filled with a desiccant that binds water molecules very quickly, but wears out in a relatively short period of time. An example of such a desiccant is zeolite. The other pouch may be filled with a desiccant that absorbs water molecules more slowly, but lasts longer. One example of such a compound is calcium oxide. Of course, embodiments of the invention are not limited to a particular number of integrated desiccant pouches, or a particular desiccant used within each pouch. The display device may have 1, 2, 3, 4, 5, 6 or more desiccant pouches inside without departing from the spirit of the invention.

Figure 11:
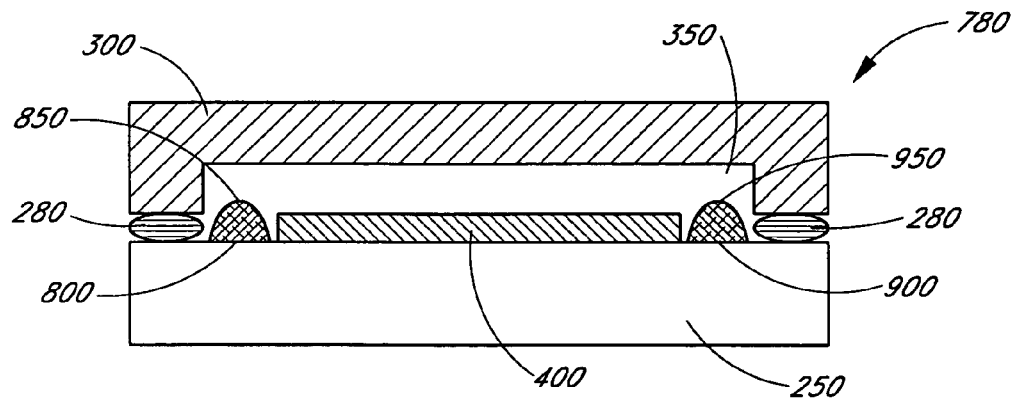
FIG. 11 schematically illustrates a third alternate embodiment of an electronic display taken across the line 10-10 from FIG. 8.

Yet another embodiment of a display 780 is illustrated in FIG. 11. In this embodiment, the desiccant pouches 850, 950 are integrated with and adhered to the transparent or semi-transparent substrate 250 instead of to the backplane 300. Preferably, the pouches 850, 950 do not contact or interfere with the display electronics. It should be realized that this embodiment is not limited to having desiccant pouches adhered only to the substrate 250. In other embodiments, both the substrate 250 and the backplane 300 have integrated desiccant pouches.

Figure 12:
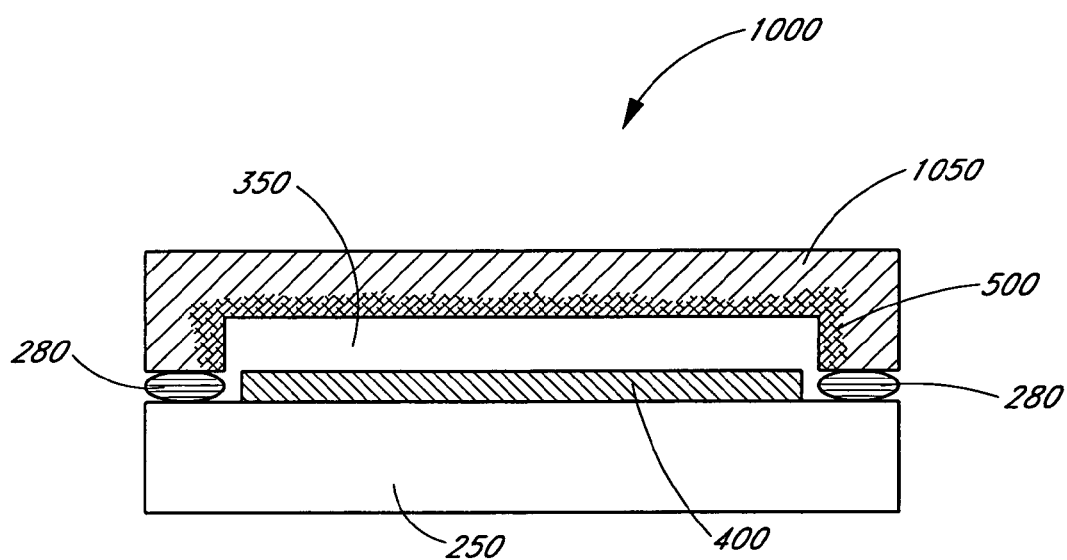
FIG. 12 schematically illustrates a fourth alternate embodiment of an electronic display taken across the line 10-10 from FIG. 8 showing desiccant material integrated into the display backplane.

FIG. 12 shows yet another embodiment of a display 1000 wherein the desiccant material 500 is integrated into the material that forms the backplane 1050. Such material can be made by incorporating the desiccant 500 into the plastic that forms the backplane 1050. Preferably, the desiccant is incorporated into the backplane 1050 on the internal side of the backplane 1050, as shown in FIG. 12. Examples of such material include 2AP (Sud-Chemie), which combines precise amounts of a desiccant, such as molecular sieve or silica gel, with a polymer. Because the desiccant material 500 is incorporated into the backplane 1050 itself, there is no need to add desiccant material 500 in a separate step during the packaging process. In addition, 2AP can be customized to control the moisture adsorption rate.

Another material suitable for a backplane 1050 is made by Capitol Specialty Plastics Inc. (Auburn, Ala.). This material combines a desiccant 500 with a channeling agent into a polymer that can be molded or extruded into many shapes. Almost any type of polymer can be used with the desiccant 500. This type of desiccant plastic allows the entire backplane 1050 to act as a moisture absorber. Other materials suitable for such a backplane 1050 include, but are not limited to, material delivered with foil protection, which can be chemically or plasma etched off, such as amorphous silicon, chrome, and similar materials.

Generally, the packaging process to produce the display may be accomplished in a vacuum, pressure between a vacuum up to and including ambient pressure, or pressure higher than ambient pressure. The packaging process may also be accomplished in an environment of varied and controlled high or low pressure during the sealing process. There may be advantages to packaging the display in a completely dry environment, but it is not necessary. Similarly, the packaging environment may be of an inert gas at ambient conditions, or the cavity 350 may be created to contain an inert gas, such as nitrogen, at ambient conditions. Packaging at ambient conditions allows for a lower cost process and more potential for versatility in equipment choice because the device may be transported through ambient conditions without affecting the operation of the device.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A display device, comprising:
   a transparent substrate;
   an interferometric modulator configured to modulate light transmitted through the transparent substrate; and
   a backplane cover disposed on the interferometric modulator, the backplane cover sealing the interferometric modulator within a package between said transparent substrate and the backplane cover, wherein the backplane cover comprises a material that includes an integrated desiccant and wherein the integrated desiccant is configured to absorb moisture within the package.

2. The display device of claim 1, wherein the backplane cover comprises a polymer and a molecular sieve or a silica gel.

3. The display device of claim 1, wherein the backplane cover comprises a desiccant, a channeling agent and a polymer.

4. The display device of claim 1 further comprising a spray coat of desiccant on a surface of the backplane cover.

5. The display device of claim 1, wherein a surface of the backplane comprises recessed areas and wherein the recessed areas comprise desiccant.

6. The display device of claim 1, wherein the desiccant is a zeolite.

7. The display device of claim 1, wherein the desiccant is calcium oxide.

8. The display device of claim 1, wherein the transparent substrate has an integrated desiccant configured to absorb moisture within the package.

9. A method of manufacturing a display device, comprising:
   providing a transparent substrate;
   forming an interferometric modulator on the transparent substrate;
   joining a backplane to the transparent substrate to form a package, wherein the package encapsulates the interferometric modulator; and
   providing within the package a desiccant contained within a membrane.

10. The method of claim 9, wherein the membrane is adhered to the backplane.

11. The method of claim 9, wherein the membrane is adhered to the transparent substrate.

12. The method of claim 9, wherein the membrane is formed of polyethylene.

13. The method of claim 9, wherein the desiccant is selected from a group consisting of zeolites, calcium sulfate, calcium oxide, silica gel, molecular sieves, surface adsorbents, bulk adsorbents, chemical reactants, and indicating silica gel.

14. A display device, comprising:
- a package comprising a transparent substrate, a backplane, and a seal applied between the backplane and the transparent substrate;
- an electronic display configured to modulate light transmitted through the transparent substrate, wherein the electronic display is formed on the transparent substrate and positioned between the transparent substrate and the backplane; and
- a desiccant contained within a pouch adhered to a surface inside the package, wherein the desiccant is configured to absorb moisture within the package.

15. The display device of claim 14, wherein the desiccant is adhered to an interior surface of the backplane.

16. The display device of claim 14, wherein the desiccant is adhered to the transparent substrate.

17. The display device of claim 14, wherein the pouch comprises polyethylene.

18. A display device, comprising:
- a transmitting means for transmitting light therethrough;
- a modulating means configured to modulating light transmitted through the transmitting means, wherein the modulating means comprises an interferometric modulator;
- an encapsulating means for sealing the modulating means within a package between the transmitting means and the encapsulating means; and
- a moisture absorbing means integrated into either the transmitting means or the encapsulating means, the moisture absorbing means configured to absorb moisture within the package.

19. The display device of claim 18, wherein the moisture absorbing means is selected from a group consisting of zeolites, calcium sulfate, calcium oxide, silica gel, molecular sieves, surface adsorbents, bulk adsorbents, chemical reactants, and indicating silica gel.

20. The display device of claim 18, wherein the encapsulating means is formed of a material comprising the moisture absorbing means.

21. The display device of claim 18, wherein at least a portion of the encapsulating means is formed of a material comprising the moisture absorbing means.

22. A display device, comprising:
- a transparent substrate;
- an electronic display configured to modulate light transmitted through the transparent substrate, wherein the electronic display is formed on the transparent substrate;
- a backplane joined to the transparent substrate to form a package, wherein the electronic display is positioned in the package between the backplane and the transparent substrate;
- at least one pouch in the package; and
- a desiccant within the at least one pouch, the desiccant being configured to absorb moisture within the package.

23. The display device of claim 22, wherein the at least one pouch is adhered to the backplane.

24. The display device of claim 22, wherein the at least one pouch is adhered to the transparent substrate.

25. The display device of claim 22, wherein the at least one pouch comprises two pouches.

26. The display device of claim 25, wherein each of the two pouches contains a different type of desiccant.

27. A method of manufacturing a backplane, comprising:
- providing a backplane having a recessed area on a surface, wherein the recessed area is created by applying a mask to the surface of the backplane and etching an area of the backplane exposed by the mask;
- applying desiccant to the recessed area on the surface of the backplane such that the desiccant is integrated into the backplane while the mask is on the surface;
- providing a transparent substrate having an interferometric modulator formed thereon; and
- joining the backplane to the transparent substrate to form a package.

28. The method of claim 27, wherein etching is sandblasting.

29. The method of claim 27, wherein etching is wet etching.

\* \* \* \* \*